(12) United States Patent
Kim et al.

(10) Patent No.: US 9,061,353 B2
(45) Date of Patent: Jun. 23, 2015

(54) PRODUCTION METHOD FOR HIGH PURITY COPPER POWDER USING A THERMAL PLASMA

(75) Inventors: Dae Hyun Kim, Ulsan-si (KR); Dong Woo Lee, Incheon-si (KR); In Dal Kim, Gyeonggi-do (KR); Sang Young Choi, Seoul (KR); Ji Hoon Lee, Ulsan-si (KR); Bo Min Jeon, Ulsan-si (KR)

(73) Assignee: POONGSAN CORPORATION, Seoul (KR)

( * ) Notice: Subject to any disclaimer, the term of this patent is extended or adjusted under 35 U.S.C. 154(b) by 330 days.

(21) Appl. No.: 13/513,712

(22) PCT Filed: Jul. 20, 2010

(86) PCT No.: PCT/KR2010/004734
§ 371 (c)(1),
(2), (4) Date: Jun. 4, 2012

(87) PCT Pub. No.: WO2011/071225
PCT Pub. Date: Jun. 16, 2011

(65) Prior Publication Data
US 2012/0240726 A1    Sep. 27, 2012

(30) Foreign Application Priority Data
Dec. 7, 2009   (KR) .................. 10-2009-0120452

(51) Int. Cl.
*B22F 9/14* (2006.01)
*B22F 9/12* (2006.01)
*B22F 1/00* (2006.01)
*C23C 14/34* (2006.01)

(52) U.S. Cl.
CPC .............. *B22F 9/12* (2013.01); *B22F 2998/10* (2013.01); *B22F 2999/00* (2013.01); *B22F 1/0048* (2013.01); *C23C 14/3414* (2013.01)

(58) Field of Classification Search
None
See application file for complete search history.

(56) References Cited

U.S. PATENT DOCUMENTS

| | | | |
|---|---|---|---|
| 4,592,781 A * | 6/1986 | Cheney et al. | 75/249 |
| 6,379,419 B1 * | 4/2002 | Celik et al. | 75/346 |
| 7,582,135 B2 * | 9/2009 | Nakamura et al. | 75/346 |

FOREIGN PATENT DOCUMENTS

| | | |
|---|---|---|
| CN | 1182456 | 5/1998 |
| GB | 1 390 352 A | 1/1971 |
| JP | 60-500872 | 6/1985 |
| JP | 08-246010 | 9/1996 |
| JP | 08-246010 | 9/1998 |
| JP | 2001-020065 | 1/2001 |

(Continued)

OTHER PUBLICATIONS

Machine Translation of JP 2004-232084, published Aug. 19, 2004.*

(Continued)

*Primary Examiner* — George Wyszomierski
(74) *Attorney, Agent, or Firm* — Andrew F. Young, Esq.; Lackenbach Siegel, LLP

(57) ABSTRACT

The present invention relates to a method of manufacturing a high purity copper (Cu) powder material useable in fabricating a sputtering target material for electronic industrial applications, for example a penetrator liner. The foregoing method has a configuration of using an apparatus composed of a raw material feeder, a plasma torch and a reactor to prepare a metal powder, and includes steps of passing a Cu powder having an average particle diameter of 30 to 450 μm through the thermal plasma torch at an introduction rate of 2 to 30 kg/hr, to thereby fabricate a Cu powder having an average particle diameter of 5 to 300 μm.

1 Claim, 2 Drawing Sheets

(56) References Cited

FOREIGN PATENT DOCUMENTS

| | | |
|---|---|---|
| JP | 2001342506 | 12/2001 |
| JP | 2002-180112 | 6/2002 |
| JP | 2001180112 | 6/2002 |
| JP | 2002180112 | 6/2002 |
| JP | 2002-371305 | 12/2002 |
| JP | 2004-225135 | 8/2004 |
| JP | 2004-232084 | 8/2004 |
| JP | 2004232084 | 8/2004 |
| JP | 2005336617 | 12/2005 |
| KR | 10-2004-0097364 | 11/2004 |
| KR | 10-2005-0033721 | 4/2005 |
| KR | 100726592 | 6/2007 |
| KR | 1020100036777 | 4/2010 |
| WO | WO 84/02864 | 8/1984 |

OTHER PUBLICATIONS

Machine Translation of JP 2004-225135, published Aug. 12, 2004.*
Boulos M: "Plasma Power Can Mark Better Powders"; Metal Powder Report, MPR Publishing Services, Srewsbury, GB, vol. 59, No. 5, May 1, 2004, pp. 16-21, XP004508833, ISSN: 0026-0657, DOI: 10.1016/S0026-0657(04)00153-5.
EP Appln. Serial No. 10836122.1 Search Report mailed Oct. 2, 2013, 7 pages—English.
Chinese Pat. Appln. Serial No. 201080055710.4, First Office Action issued Dec. 3, 2013, 4 pages—English, 5 pages—Chinese.
Japan Pat. Appln. Serial No. 2012-543006, Office Action issued Jun. 3, 2014, 2 pages—English, 2 pages—Japanese.
Korean Pat. Appln. Serial No. KR 10-2009-0120452, Notice of Allowance mailed May 27, 2012, 2 pages—English, 2 pages—Korean.
Korean Pat. Appln. Serial No. KR 10-2009-0120452, Notice of Office Action mailed Nov. 5, 2011, 3 pages—English, 4 pages—Korean.
PCT Appln. Serial No. PCT/KR2010/004734, ISR mailed Feb. 10, 2011, 2 pages—English, 2 pages Korean.
Chinese Patent Appln. No. 201080055710.4, Office Action issued Jan. 10, 2015, 3 pages—English, 14 pages—Chinese.

* cited by examiner

PRODUCTION METHOD FOR HIGH PURITY COPPER POWDER USING A THERMAL PLASMA

CROSS REFERENCE TO RELATED APPLICATIONS

This application related to and claims priority from International Ser. No. PCT/KR2010/004734 filed Jul. 20, 2010, the entire contents of which are enclosed herein by reference, which inturn claims priority from Korean Ser. No. 10-2009-0120452 filed Dec. 7, 2009.

BACKGROUND ART

With rapid progress in the information industry, sputtering target materials used for fabrication of information industrial equipment are used in large quantities. It is well known that an optimum method for manufacturing such target materials is a sintering process of a high purity metal powder raw material. For this reason, demand for high purity and melting point metal powder is increasing while, owing to high functionality of the information equipment, increase in purity is required.

Moreover, in sintering and manufacturing a target in a near net shape, spheroidizing the powder described above is necessary while a high purity copper ('Cu') powder is required for use as a conductive paste or a penetrator liner or the like.

A method of manufacturing a high purity Cu powder, which includes repeatedly conducting chemical wet separation and refinement of ore, preparing a high purity intermediate oxide or compound, decomposing the oxide or compound, and conducting hydrogen reduction thereof, thereby fabricating a metal powder, has been generally known in the art.

Korean Laid-Open Patent Publication No. 10-2004-0097364 describes a wet-prepared powder wherein oxygen content is considerably high, i.e., 2000 ppm or more, and impurity residue remains in oxide, thus causing a restriction in high refinement and significant problems in environmental contamination due to various solutions and controlling (managing) a particle diameter of the prepared powder to 1 μm or less.

Compared to a wet separation method entailing the above problems, Korean Laid-Open Patent Publication No. 10-2005-0033721 describes a method for manufacturing carbon nanotubes using DC thermal plasma at a very high temperature. A DC plasma technique cannot avoid mixing of impurities due to corrosion of an electrode, thus causing a difficulty in fabricating a high purity metal powder.

Meanwhile, a method for manufacturing a high purity powder using RF thermal plasma has been disclosed in Japanese Laid-Open Patent Publication No. 2001-342506 (hereinafter, 'cited invention A') and Japanese Laid-Open Patent Publication No. 2002-180112 (hereinafter, 'cited invention B').

According to cited invention A, a metal block is milled to produce a powder and the powder is treated through thermal plasma treatment to form a high purity metal powder such as tungsten (W), molybdenum (Mo), tantalum (Ta), ruthenium (Ru), etc. On the other hand, cited invention B describes a high purity metal powder such as tungsten (W), molybdenum (Mo), tantalum (Ta), ruthenium (Ru), etc., fabricated by treating a high melting point metal oxide or metal compound having an average particle diameter of 10 to 320 μm, through RF thermal plasma while introducing hydrogen.

The foregoing cited inventions are characterized in that high melting point metal is neither molten nor vaporized while passing the high melting point metal through thermal plasma, however, impurities having a relatively low melting point are evaporated and blown in a cyclone, to thus attain high refinement. However, for copper (Cu) having a relatively low melting point, since not only impurities but also a raw powder may be evaporated and blown off, a high purity Cu powder cannot be manufactured according to the methods described in the cited inventions.

DETAILED DESCRIPTION OF THE INVENTION

Technical Problem

The present invention is directed to solving the problems described above in regard to conventional technologies and to production of Cu powder having a relatively low melting point although using thermal plasma as described in the foregoing cited inventions. Therefore, an object of the present invention is to provide a high purity Cu powder fabricated by suitably applying (or controlling) an introduction rate to feed a raw powder into a thermal plasma torch and a reaction-passage section in a reactor, instead of techniques known in the related art.

Technical Solution

In order to achieve the above object of the present invention, there is provided a method of manufacturing a metal powder using a thermal plasma torch, including: passing a Cu powder having an average particle diameter of 30 to 450 μm through a thermal plasma torch at an introduction rate of 2 to 30 kg/hr, thus forming a high purity Cu powder having an average particle diameter of 5 to 300 μm. The Cu powder introduced into the thermal plasma torch has preferably a purity of 95 to 99% while the high purity Cu powder finally obtained through the thermal plasma torch may be 4N grade (99.99%) or higher.

Of course, the present invention may be applied not only to metals having a relatively low melting point such as aluminum (Al), silver (Ag), nickel (Ni), etc., but also to high melting point metal powders such as tungsten (W), molybdenum (Mo), ruthenium (Ru), tantalum (Ta), etc.

The raw powder used herein may be a Cu powder having an average particle diameter of 30 to 450 μm. The reason for this is considered to be that, if the raw powder is fine and has a particle diameter of 30 μm or less, the powder obtained after plasma reaction has an average particle diameter of 5 μm or less, in turn inducing agglomeration of the powder and, if the particle diameter of the raw powder is 450 μm or more, effects of the plasma treatment are considerably deteriorated. According to the present invention, the metal powder may pass through the thermal plasma torch at an introduction rate of 2 to 30 kg/hr and a reactor may be designed to have a length of at least 1.4 m and not more than 2.5 m, which are clearly distinguishable from techniques in the art.

A behavior gas generating thermal plasma may be, for example, selected from argon (Ar), hydrogen ($H_2$), helium (He), etc. Also, since high refinement effects tend to be improved with increasing amount of hydrogen added, 5 to 50 vol % of hydrogen is added to Ar.

Specifically, when a content of hydrogen is at least 5 vol % or more, the foregoing effects are rapidly increased. On the contrary, when the hydrogen content is 50 vol % or more, high refinement effects are rapidly decreased. Therefore, the amount of hydrogen added may range from 5 to 50 vol %.

FIG. 1 is a schematic view showing a thermal plasma apparatus used for the present invention. The apparatus may comprise of: a feeder 2 to supply a powdery raw material; a plasma torch 1, at the bottom of the feeder, which has a coil wound around an outer side of a water cooling insulation tube, and has a high temperature region for thermal plasma 6 formed in the torch by applying a high frequency electric field to the coil; a reactor 3 in which the introduced raw powder is highly refined by thermal plasma; a cyclone 4 to collect the removed impurities; and a back filter 5 to collect a high purity metal powder fabricated from the foregoing.

The thermal plasma generated by a high frequency power supply is referred to as RF thermal plasma (or high frequency plasma). Occurrence of the RF plasma does not need an electrode while avoiding contamination due to evaporation of an anode material. The high frequency power supply may apply a frequency ranging from 4 to 13.5 MHz, however, preferably 4 MHz to enlarge a high temperature region.

Although the present invention may have similarity to conventional technologies, in view of passing a raw material through a thermal plasma torch, a method according to the conventional technologies evaporates and blows off impurities as well as the raw powder, which cannot be used to Cu powder to be refined according to the present invention.

Moreover, the present invention is preferably executed at a limited introduction rate of the raw powder ranging from 2 to 30 kg/hr.

With regard to limitation of the introduction rate of the raw material, if the introduction rate is 2 kg/hr or less, productivity is deteriorated without facilitating improvement of purity. On the other hand, when the introduction rate is 30 kg/hr or more, high refinement effects may be significantly reduced. Accordingly, the foregoing value may range from 2 to 30 kg/hr.

Further, the present invention more preferably designs a length of the reactor 3 to a range of 1.4 m to 2.5 m. That is, defining the length of the reactor to 2 m or more is different from conventional methods in the art and, in the case where the reactor has a length of 1.4 m or less, the raw powder having a particle diameter of more than 200 μm cannot be treated.

That is, if the raw powder having a particle diameter of more than 200 μm is used, a section wherein the raw powder is molten then cooled while passing therethrough, may be necessary. Therefore, if the reactor has a length of 1.4 m or less, the raw powder having a particle diameter of 200 μm or more may not be completely solidified but settled on the bottom of the reactor. Thus, spheroidization of the powder rarely occurs and, in the case of 2.5 m, production costs are increased while effects corresponding thereto are not satisfied.

Advantageous Effects

As set forth above, the present invention suitably adopts an introduction rate (2 to 30 kg/hr) of a raw powder for passing through a plasma torch and a length of a reactor (1.4 to 2.5 m), thereby fabricating a high purity metal powder with improvement in difficulties of evaporating and blowing off a low melting point raw powder as well as impurities.

BEST MODE FOR CARRYING OUT THE INVENTION

Hereinafter, the present invention will be more clearly understood with reference to the following examples.

TABLE 1

|  | Raw powder | | Plasma treatment (introduction rate of 5 kg/hr) | | Plasma treatment (introduction rate of 30 kg/hr) | |
| --- | --- | --- | --- | --- | --- | --- |
|  | Particle size (μm) | Purity (%) | Particle size (μm) | Purity (%) | Particle size (μm) | Purity (%) |
| Example 1 | 20 | 96 | 7.5 | 99.999 | 13.3 | 99.8 |
| Example 2 | 33 | 96 | 11.8 | 99.999 | 24.9 | 99.5 |
| Example 3 | 48 | 97 | 19.8 | 99.99 | 38.7 | 99.8 |
| Example 4 | 86 | 97 | 35.3 | 99.999 | 68.5 | 99.6 |
| Example 5 | 103 | 96 | 48.1 | 99.99 | 92.03 | 99.2 |
| Example 6 | 233 | 96 | 110.5 | 99.99 | 189.8 | 99.3 |
| Example 7 | 588 | 97 | 259.8 | 99.45 | 508.3 | 97.3 |

EXAMPLE 1

Figure 1:
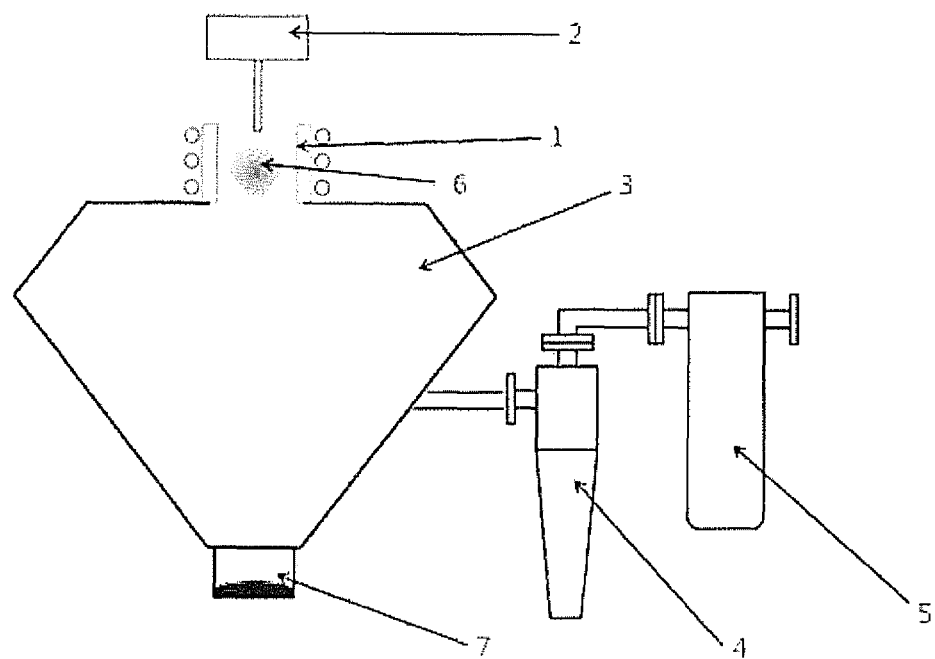
FIG. 1 illustrates a plasma apparatus used for a manufacturing method according to the present invention.

A Cu powder having an average particle diameter of 20 μm and a purity of 96% was used as a raw material and subjected to RF thermal plasma treatment as shown in FIG. 1, to thus prepare a high purity Cu powder of 7.5 μm.

A high frequency power supply used herein had a frequency of 4 MHz, and the Cu powder was fed into a plasma high temperature region through a raw material feeder and molten by thermal plasma. Then, spheroidization and high refinement were executed with the molten material. Here, an introduction rate of the raw powder was 5 kg/hr and 30 kg/hr, respectively.

EXAMPLE 2

The procedure in Example 1 was repeated to prepare a high purity spherical Cu powder having a purity of 99.999% and an average particle diameter of 11.88 μm, except that a Cu powder having a purity of 96% and an average particle diameter of 33 μm was used as a raw material.

EXAMPLE 3

The procedure in Example 1 was repeated to prepare a high purity spherical Cu powder having a purity of 99.99% and an average particle diameter of 19.8 μm, except that a Cu powder having a purity of 97% and an average particle diameter of 48 μm was used as a raw material.

EXAMPLE 4

The procedure in Example 1 was repeated to prepare a high purity spherical Cu powder having a purity of 99.99% and an average particle diameter of 35.3 μm, except that a Cu powder having a purity of 97% and an average particle diameter of 86 μm was used as a raw material.

EXAMPLE 5

The procedure in Example 1 was repeated to prepare a high purity spherical Cu powder having a purity of 99.99% and an average particle diameter of 48.1 μm, except that a Cu powder having a purity of 96% and an average particle diameter of 103 μm was used as a raw material.

EXAMPLE 6

The procedure in Example 1 was repeated to prepare a high purity spherical Cu powder having a purity of 99.99% and an average particle diameter of 110.5 μm, except that a Cu powder having a purity of 96% and an average particle diameter of 233 μm was used as a raw material.

EXAMPLE 7

The procedure in Example 1 was repeated to prepare a high purity spherical Cu powder having a purity of 99.45% and an average particle diameter of 259.8 μm, except that a Cu powder having a purity of 97% and an average particle diameter of 588 μm was used as a raw material.

MODE FOR INVENTION

Figure 2:
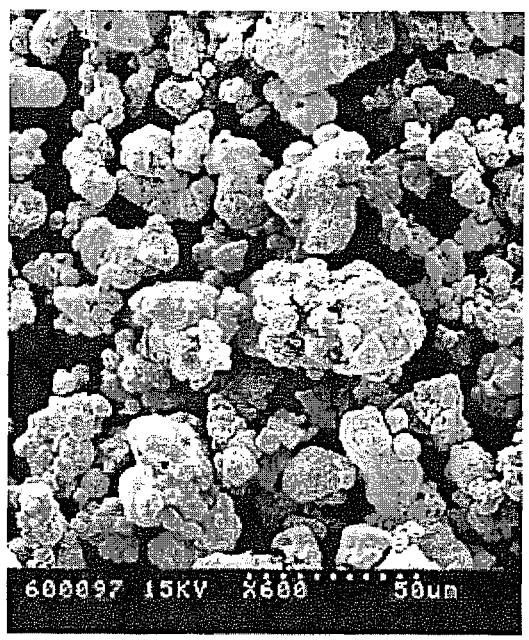
FIG. 2 is a micrograph showing a raw powder (Cu) before plasma treatment.
Figure 3:
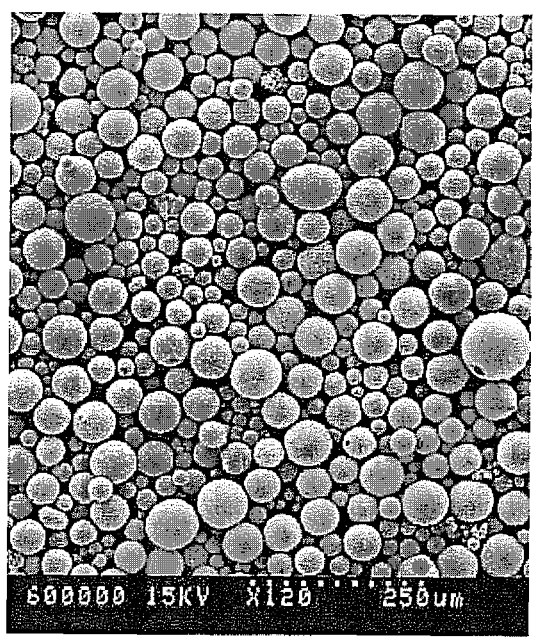
FIG. 3 is a micrograph showing a high purity metal powder (Cu) after plasma treatment.

FIGS. 2 and 3 are micrographs showing metal powder, more particularly, FIG. 2 illustrates a state of a raw powder (Cu) state before plasma treatment while FIG. 3 illustrates a metal powder (Cu) prepared according to the foregoing examples.

As described above, it was found that the metal powder obtained after plasma treatment is composed of microfine particles and has a spherical morphology.

INDUSTRIAL APPLICABILITY

The present invention may be widely employed in a high purity copper powder material for fabrication of a sputtering target material used in electronic industrial applications, a conductive paste, a penetrator liner, or the like.

The invention claimed is:

1. A method of manufacturing a high purity spherical copper (Cu) powder through plasma, which uses an apparatus composed of a raw material feeder, a thermal plasma torch and a reactor to prepare a metal powder, wherein the plasma is a thermal plasma generated from a gas that includes argon with 5 to 50% by volume of hydrogen added, and the reactor is formed to have a length of 1.4 to 2.5 meters (m), comprising the steps of:

passing a Cu powder having an average particle diameter of 30 to 450 μm through the thermal plasma torch and the reactor at an introduction rate of 2 to 30 kg/hr, to thereby fabricate a Cu powder having an average particle diameter of 5 to 300 μm, wherein the Cu powder having the average particle diameter of 30 to 450 μm has a purity of 95 to 99%, and the purity of the Cu powder having the average particle diameter of 5 to 300 μm is 4N grade (99.99%) or more.

* * * * *